United States Patent
Saia et al.

(10) Patent No.: US 6,767,764 B2
(45) Date of Patent: Jul. 27, 2004

(54) MICROELECTROMECHANICAL SYSTEM DEVICE PACKAGING METHOD

(75) Inventors: Richard Joseph Saia, Niskayuna, NY (US); Kevin Matthew Durocher, Waterford, NY (US); Christopher James Kapusta, Duanesburg, NY (US); Matthew Christian Nielsen, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/167,546

(22) Filed: Jun. 12, 2002

(65) Prior Publication Data

US 2002/0173080 A1 Nov. 21, 2002

Related U.S. Application Data

(62) Division of application No. 09/681,304, filed on Mar. 15, 2001.

(51) Int. Cl.[7] .................. H01L 21/44; H01L 21/4763
(52) U.S. Cl. .................. 438/118; 438/124; 438/125; 438/126; 438/127; 438/622
(58) Field of Search .................. 438/118, 124, 438/125, 126, 127, 622, 422, 456, 106, 107, 108; 257/758, 700, 725, 659, 704, 790; 359/290–294, 295, 298, 322, 232

(56) References Cited

U.S. PATENT DOCUMENTS

| | | | |
|---|---|---|---|
| 5,161,093 A | 11/1992 | Gorczyca et al. | |
| 5,353,498 A | 10/1994 | Fillion et al. | |
| 5,522,006 A | 5/1996 | Takeuchi et al. | |
| 5,527,741 A | 6/1996 | Cole et al. | |
| 5,731,047 A | * | 3/1998 | Noddin |
| 5,757,072 A | * | 5/1998 | Gorowitz et al. |
| 5,833,903 A | 11/1998 | Centofante | |
| 6,150,719 A | 11/2000 | Saia et al. | |
| 6,499,214 B2 | * | 12/2002 | Li et al. |

OTHER PUBLICATIONS

U.S. patent application, Ser. No. 09/399,461, Filed Sep. 20, 1999, Entitled "HDI Chip Attachment Method for Reduced Processing" by El Balch, et al.
U.S. patent application, Ser. No. 09/411,101, Filed 10/99, Entitled " Circuit Chip Package and Fabrication Method" by Fillion, et al.
U.S. patent application, Ser. No. 09/469,749, Filed Dec. 22, 1999, Entitled " Apparatus, Method and Product Therefrom, for Aligning Die to Interconnect Metal on Flex Substrate".
JT Butler, et al, "Adapting Multichip Model Foundries for MEMS Packaging", *International Journal of Microcircuits and Electronic Packaging*, vol. 21, No. 2, 6 pages, $2_{nd}$ Qtr. 1998.
AD Wolfrum, Shipley Multiposit XP–9500 CC–1 Photodielectric, 4 pages, 1995.

* cited by examiner

*Primary Examiner*—Long Pham
*Assistant Examiner*—Dilinh Nguyen
(74) *Attorney, Agent, or Firm*—William E. Powell; Patrick K. Patnode

(57) ABSTRACT

A method for packaging a microelectromechanical system (MEMS) device comprises: using a partially-cured adhesive to attach a release sheet to a MEMS package flexible layer; providing a cavity extending through the release sheet and at least partially through the MEMS package flexible layer; removing the release sheet; and attaching the MEMS device to the MEMS package flexible layer with a MEMS structure of the MEMS device being positioned within the cavity.

8 Claims, 3 Drawing Sheets

Fig. 5
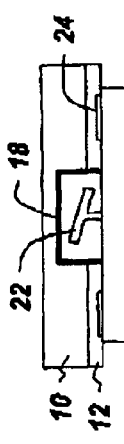
Fig. 6
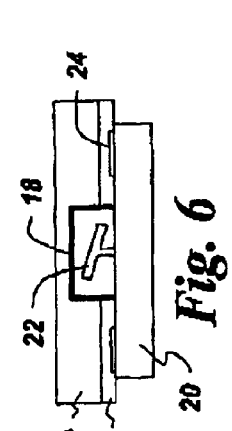
Fig. 7
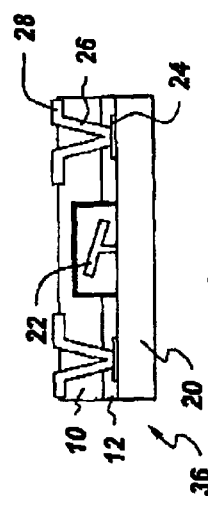
Fig. 8
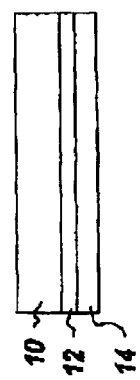
Fig. 1
Fig. 2
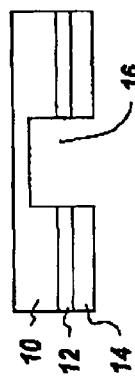
Fig. 3
Fig. 4
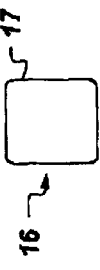

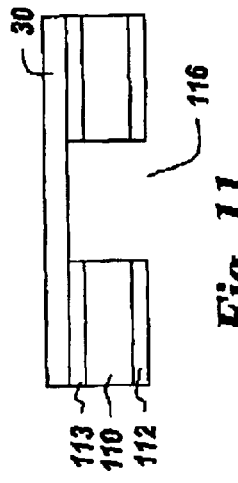
Fig. 9
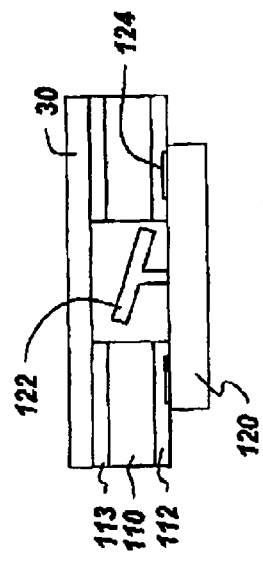
Fig. 10a
Fig. 10b
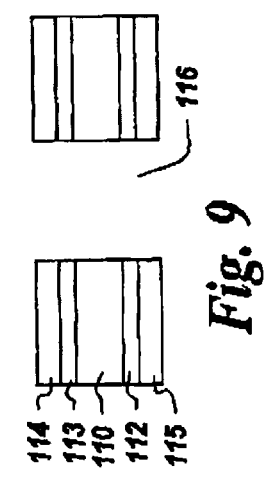
Fig. 11
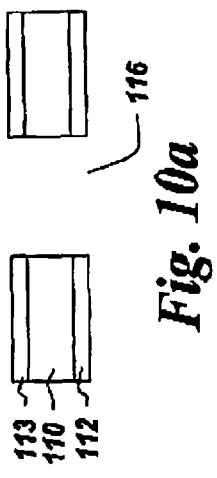
Fig. 12
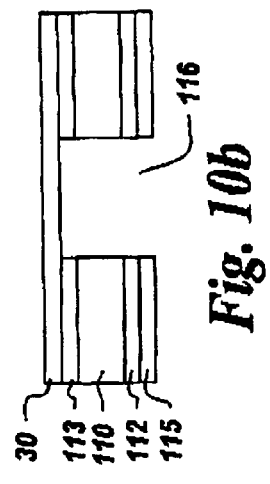
Fig. 13

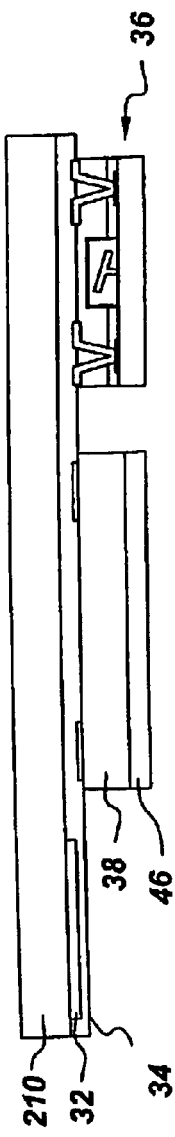
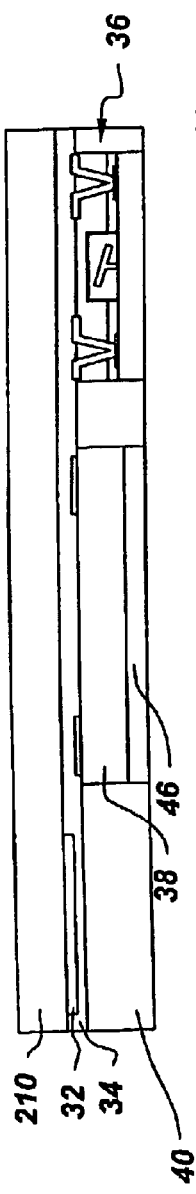
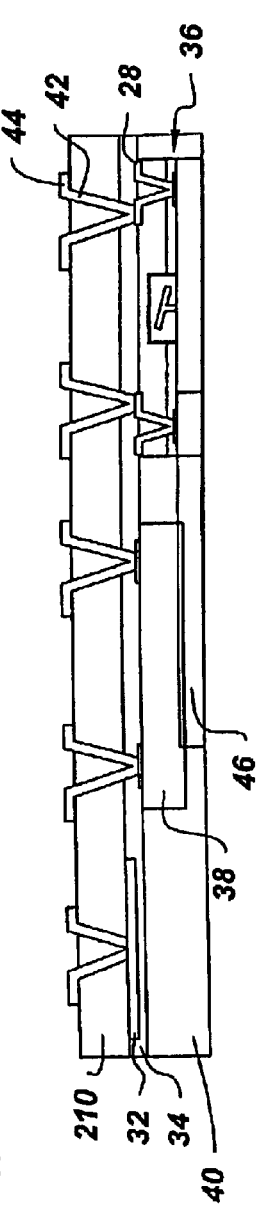
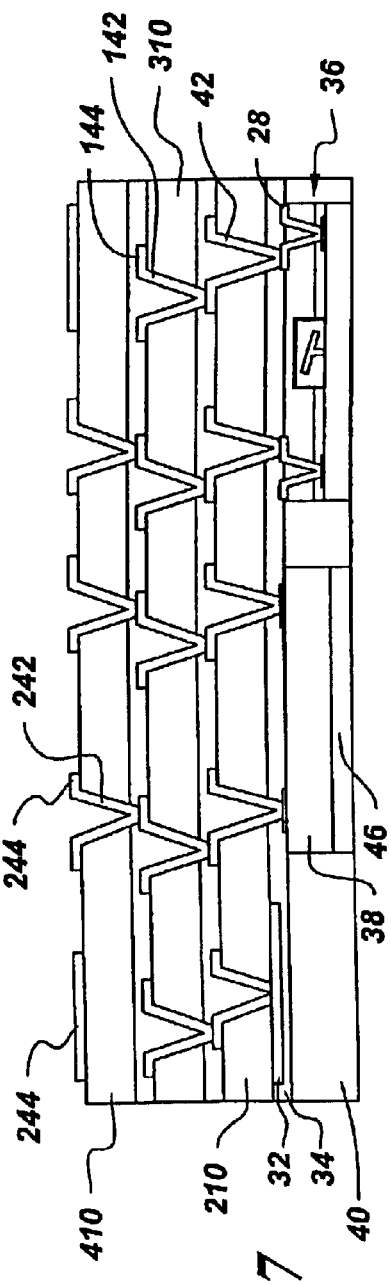
Fig. 14
Fig. 15
Fig. 16
Fig. 17

US 6,767,764 B2

MICROELECTROMECHANICAL SYSTEM DEVICE PACKAGING METHOD

This application is a division of application Ser. No. 09/681,304, filed Mar. 15, 2001 which is hereby incorporated by reference in its entirety.

FEDERAL RESEARCH STATEMENT

This invention was made with United States Government support under contract number F2960100C0171 awarded by the United States Air Force. The United States Government has certain rights in the invention.

BACKGROUND OF THE INVENTION

The invention relates generally to packaging for microelectromechanical systems (MEMS).

MEMS devices include fragile structures such as thin flexible membranes or rigid moving parts. The fragile structures can easily be damaged mechanically or by exposure to moisture. Protection of the fragile structures has posed a problem both for use of MEMS devices and for multichip module (MCM) packaging of MEMS devices.

Most MEMS devices are packaged in an "unreleased" state and require a "release" etch prior to operational use. The release process often includes removing selected materials to create three-dimensional structures and, in some cases, to allow physical movement. Released MEMS devices are typically very fragile and require special handling. MCM packaging of unreleased MEMS devices requires that the package materials be compatible with the MEMS release procedures, and protective enclosures typically are not provided as part of the package.

Another challenge when fabricating systems with MEMS devices involves monolithic integration of MEMS devices with associated interface electronics when such integration requires the MEMS device fabrication to be compatible with standard complementary metal oxide semiconductor (CMOS) integrated circuit (IC) chip fabrication processes.

SUMMARY OF THE INVENTION

It would be desirable to provide an MCM packaging method capable of reliably packaging released MEMS devices. Packaging released MEMS devices would permit the MEMS devices to be pretested for functionality. It would further be beneficial for the packaging method to provided an enclosure to protect fragile MEMS structures from mechanical and/or chemical attack.

It would further be desirable to use the very small form factor (footprint) of the chip-on-flex type packaging to permit integration of CMOS IC chips with MEMS devices such that the resulting form factor is comparable to monolithic integrated devices. Such packaging would provide more flexibility in MEMS system design.

Briefly, in accordance with one embodiment of the present invention, a method for packaging a microelectromechanical system (MEMS) device comprises: using a partially-cured adhesive to attach a release sheet to a MEMS package flexible layer; providing a cavity extending through the release sheet and at least partially through the MEMS package flexible layer; removing the release sheet; and attaching the MEMS device to the MEMS package flexible layer with a MEMS structure of the MEMS device being positioned within the cavity.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIGS. 1–7 illustrate stages in an MEMS device packaging process in accordance with one embodiment of the present invention.

FIGS. 8–13 illustrate stages in an MEMS device packaging process in accordance with another embodiment of the present invention.

FIGS. 14–17 illustrate stages in an MEMS device packaging process in accordance with another embodiment of the present invention.

DETAILED DESCRIPTION

FIGS. 1–7 illustrate stages in an MEMS device packaging process in accordance with one embodiment of the present invention wherein a method for packaging a microelectromechanical system (MEMS) device comprises: using a partially-cured adhesive 12 to attach a release sheet 14 to a MEMS package flexible layer 10 (FIG. 1); providing a (meaning "at least one") cavity 16 extending through the release sheet and partially through the MEMS package flexible layer; removing the release sheet (FIG. 2); and attaching a (meaning "at least one") MEMS device to the MEMS package flexible layer with a MEMS structure 22 of the MEMS device being positioned within the cavity (FIG. 6).

Referring more specifically to FIG. 1, in one embodiment, MEMS package flexible layer 10 comprises a polyimide (such as KAPTON™ polyimide KAPTON is a trademark of DuPont Company) having a thickness ranging from about 100 micrometers to about 125 micrometers, and release sheet 14 comprises a polyimide such as KAPTON polyimide having a thickness of about 12.5 micrometers.

In one embodiment adhesive 12 is coated on the MEMS package flexible layer and partially cured prior to attachment of the release sheet. A "partially-cured" adhesive, as referred to herein, is meant to include an adhesive with solvent removed that can remain in contact with the flexible layer without dripping and that has not been chemically cured to the point where the adhesive is no longer "tacky" or "sticky" to other surfaces. The adhesive may comprise a material such as a conventional photodielectric material available from Shipley Co. and/or a conventional epoxy material available from Ciba Specialty Chemicals. In one embodiment, for example, the adhesive comprises a mixture of Shipley's Multiposit XP 9500 and Ciba Specialty Chemicals" CY 184 (20% by weight) and has a thickness of about 12 micrometers. In a more specific embodiment, the adhesive is partially cured at a temperature ranging from about 70° C. to about 90° C.

As shown in FIG. 2, cavity 16 extends through the release sheet, the adhesive, and partially through the MEMS package flexible layer. The depth of the cavity in the MEMS package flexible layer is selected to be sufficient to encompass the MEMS structure 22 of the MEMS device 20 (FIG. 6). In one embodiment, cavity 16 is formed using laser ablation by a technique such as described in E. W. Balch et al., "HDI Chip Attachment Method for Reduced Processing," U.S. application Ser. No. 09/399,461, filed Sep. 20, 1999, for example. Release sheet 14 is useful for protecting the adhesive from soot and other debris that can result from forming the cavity. After formation, cavity 16 can be cleaned by a process such as plasma etching, for example. Although a single cavity is shown for purposes of example, cavity 16 may comprise one or more cavities.

FIG. 3 is a top view of one cavity perimeter 17 in accordance with an embodiment of the present invention wherein the cavity has a smooth-surfaced perimeter 17. "Smooth-surfaced perimeter" is meant to encompass any perimeter without sharp edges (such as 90 degree corners in square or rectangular perimeters). Examples of smooth-surfaced perimeters include ovals, circles, rounded rectangles as shown in FIG. 3, or other straight line perimeters having rounded corners or corners of greater than 120 degrees, for example. Smooth-surfaced perimeters are useful for evenly distributing any excess adhesive that is close to the surface of MEMS structure 22. Harsh-surfaced perimeters such as 90 degree corners create the potential for localized stress and excess flow of adhesive (and thus the potential for interference with MEMS structure 22).

As shown in FIG. 4, cavity 16 may be coated with an optional protective coating 18. In one embodiment, the protective coating comprises a hermetic seal on MEMS package flexible layer 10. A useful material for coating 18, for example, is amorphous hydrogenated carbon (also known as diamond like carbon or DLC). Commonly assigned Saia et al., U.S. Pat. No. 6,150,719 describes a useful process for depositing DLC wherein a DLC composite film comprises a plurality of layers of hard DLC (DLC deposited with a magnitude of bias voltage greater than about 300 volts) alternating with a plurality of layers of soft DLC (DLC deposited with a magnitude of bias voltage in the range of about −100 volts to about −300 volts) to a collective thickness range of about 0.5 micrometers to about 2 micrometers.

As shown in FIG. 5, after release sheet 14 (of FIG. 4) is removed, the protective coating remains only in cavity 16. The removal can be accomplished in any convenient manner. In one embodiment, for example, the removal is accomplished by manually peeling the release sheet off the MEMS package flexible layer. Smooth release sheets are typically easier to remove than roughened release sheets.

MEMS device 20 may be attached to MEMS package flexible layer 10 in the orientation shown in FIG. 6 or, alternatively, in an inverse orientation with MEMS package flexible layer facing "down" and the MEMS device being placed face down onto adhesive 12 with the MEMS device being positioned within cavity 6. After the MEMS device is attached, adhesive 12 can be fully cured to secure the MEMS package flexible layer to the MEMS device. For ease of fabrication, adhesive 12 may comprise a material capable of adhering to the materials of MEMS package flexible layer 10, release sheet 14 and MEMS device so that the same adhesive can be used for both process steps. In another embodiment the adhesive of FIG. 6 that attaches the MEMS package flexible layer to the MEMS device is a different adhesive than the adhesive that earlier attached the MEMS package flexible layer to the release layer. "Different adhesive" in this context means either a different material or the same type of material freshly applied on the MEMS package flexible layer prior to attachment of the MEMS device.

In one embodiment, as shown in FIG. 7, the fabrication process further comprises providing MEMS vias 26 through the MEMS package flexible layer extending to connection pads 24 of the MEMS device and applying a MEMS pattern of electrical conductors 28 on the MEMS package flexible layer and extending through the vias to the connection pads.

Vias 26 may be formed by laser ablation, for example, and in one embodiment the vias have an aspect ratio of less than or equal to about 2:1 (depth: bottom of via opening). Pattern of electrical conductors 28 may be applied to the entire surface of MEMS package flexible layer 10 and vias 26, pattered using standard photolithography techniques, and then etched, for example. In one embodiment, the pattern of electrical conductors comprises about 1000 angstroms of sputtered titanium coated by about 4 micrometers of electroplated copper coated in turn by about 1000 angstroms of sputtered titanium. If desired, excess material of MEMS package flexible layer 10 can be removed (by cutting, for example) from the resulting package 36.

FIGS. 8–13 illustrate stages in an MEMS device packaging process in accordance with another embodiment of the present invention. The embodiment of FIGS. 8–13 has similarities to the embodiment of FIGS. 1–7 with one distinction being, for example, that cavity 116 extends completely through MEMS package flexible layer 110 (shown in FIG. 9).

Additionally, as shown in FIG. 8, the process of attaching the release sheet to the MEMS package flexible layer comprises attaching first and second release sheets 114 and 115 on first and second sides 11 and 13 of the MEMS package flexible layer 110. In one embodiment, the process of attaching first and second release sheets 114 and 115 comprises coating a first side 11 of the MEMS package flexible layer with adhesive, partially curing the adhesive, and attaching the first release sheet; and then coating a second side 13 of the MEMS package flexible layer with adhesive, partially curing the adhesive, and attaching the second release sheet. In an alternative embodiment, the first and second release sheets are simultaneously laminated on the first and second sides of the MEMS package flexible layer.

The process of removing the release sheet comprises removing the first and second release sheets (shown in FIG. 10). Further, as shown in FIG. 11, a cover 30 is attached over to the MEMS package flexible layer such that the cover overlies the cavity. The term "overlies" is used herein for example and is not intended to imply a directional relation. The cover may comprise a material such as KAPTON polyimide, for example, and in one embodiment has a thickness of about 25 micrometers. In one embodiment, attaching the cover occurs prior to attaching the MEMS device. For increased ease of handling the MEMS package flexible layer, in one embodiment, first release layer 114 is removed and cover 30 is attached prior to the removal of second release layer 115.

MEMS package flexible layer 110 (with cavity 116) and cover 30 collectively define a region for protecting MEMS structure 122 (shown in FIG. 12). Package 136 of FIG. 13 can be completed in a similar manner as discussed with respect to package 36 of FIG. 7.

The previously described embodiments of the present invention have many advantages. For example, rugged chip scale packages which are planar on the top surface can easily be fabricated. These chip scale packages allow released MEMS die to be packaged as any other die without requiring changes or compromises to standard MCM processing.

FIGS. 14–17 illustrate stages in a MEMS device packaging process in accordance with another embodiment of the present invention wherein a package 36 (meaning "at least one package" or, more specifically the MEMS package flexible layer and the MEMS pattern of electrical conductors of the at least one package) is attached to a multichip module (MCM) flexible layer 210 (FIG. 14); a circuit chip 38 (meaning at least one) is attached to the MCM flexible layer;

a substrate 40 is positioned to face the MCM flexible layer and at least partially surround the MEMS device and the circuit chip (FIG. 15); MCM vias 42 are provided through the MCM flexible layer extending to the circuit chip and to the MEMS pattern of electrical conductors (FIG. 16); and an MCM pattern of electrical conductors 44 is applied on the MCM flexible layer and extending through the MCM vias to circuit chip and to the MEMS pattern of electrical conductors. Although package 36 (of FIG. 7) is shown in the embodiment of FIGS. 14–17 for purposes of example, the present invention is not limited to use with package 36. Furthermore, although FIGS. 14–17 relate to MEMS device packaging in a flexible layer type arrangement for purposes of example, packages 36 and 136 (FIGS. 7 and 13) can be further packaged by any conventional packaging including wire bonding and ceramic substrate type high density interconnecting for example.

FIG. 14 illustrates an embodiment wherein MCM flexible layer 210 comprises a flexible layer prepatterned with pattern of electrical conductors 32. Examples of such layers are provided in Cole et al., U.S. Pat. No. 5,527,741. As discussed with respect to FIGS. 1–7, an adhesive 34 is useful for attaching the MEMS device and the circuit chip. As also shown in FIG. 14, a shim 46 may be attached to the backside of the circuit chip (shown) or MEMS device (not shown) for purposes of heat dissipation and/or ground plane access.

FIG. 15 shows the addition of substrate 40. In one embodiment substrate 40 is a molded polymer substrate fabricated in a similar manner as discussed in Fillion et al., U.S. Pat. No. 5,353,498. If a shim 46 is present on the backside of a circuit chip or a MEMS device, it is beneficial to keep an outer surface of the shim on the same plane as an outer surface of the substrate.

MCM vias 42 and MCM pattern of electrical conductors 44 can be formed in a similar manner as discussed with respect to MEMS vias 26 and MEMS pattern of electrical conductors 28. If desired, one or more additional MCM flexible layers 310 and 410 and one or more additional corresponding patterns of electrical conductors 144 and 244 can be used.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for packaging a microelectromechanical system (MEMS) device comprising:
   using a partially-cured adhesive to attach first and second release sheets on first and second sides of a MEMS package flexible layer;
   ablating the MEMS package flexible layer and at least one of the first and second release sheets to provide a cavity extending completely through the MEMS package flexible layer and the at least one of the first and second release sheets,
   removing the first and second release sheets;
   attaching a cover over to the MEMS package flexible layer such that the covet overlies the cavity, wherein attaching the cover occurs prior to removing the second release sheet; and
   attaching the MEMS device to the MEMS package flexible layer with a MEMS structure of the MEMS device being positioned within the cavity.

2. The method of claim 1 further comprising providing MEMS vias through the MEMS package flexible layer and the cover extending to connection pads of the MEMS device and applying a MEMS pattern of electrical conductors over the MEMS package flexible layer and the cover and extending through the MEMS vias to the connection pads.

3. The method claim 1 wherein attaching the MEMS device comprises using the adhesive.

4. The method of claim 1 wherein providing the cavity comprises providing a cavity having a smooth-surfaced perimeter.

5. The method of claim 1, wherein the adhesive comprises a mixture of photodielectric and epoxy materials.

6. The method of claim 1 wherein attaching first and second release sheets comprises:
   coating a first side of the MEMS package flexible layer with adhesive, partially curing the adhesive, and attaching the first release sheet; and then
   coating a second side of the MEMS package flexible layer with adhesive, partially curing the adhesive, and attaching the second release sheet.

7. The method of claim 1 wherein attaching the cover occurs prior to attaching the MEMS device.

8. A method for packaging a microelectromechanical system (MEMS) device comprising:
   coating an MEMS package flexible layer with an adhesive;
   partially curing the adhesive;
   using an adhesive to attach first and second release sheets on first and second sides of the MEMS package flexible layer;
   providing a cavity extending completely through the MEMS package flexible layer and at least one of the first and second release sheets;
   removing the first and second release sheets;
   attaching a cover over to the MEMS package flexible layer such that the cover overlies the cavity, wherein attaching the cover occurs prior to removing the second release sheet; and
   using the adhesive to attach the MEMS device to the MEMS package flexible layer with a MEMS structure of the MEMS device being positioned within the cavity;
   providing MEMS vias through the MEMS package flexible layer and the cover extending to connection pads of the MEMS device; and
   applying a MEMS pattern of electrical conductors over the MEMS package flexible layer and the cover and extending through the MEMS vias to the connection pads.

* * * * *